United States Patent
Saito

(10) Patent No.: US 7,893,533 B2
(45) Date of Patent: Feb. 22, 2011

(54) SEMICONDUCTOR DEVICE, MOUNTING STRUCTURE, ELECTRO-OPTICAL APPARATUS, ELECTRONIC SYSTEM, AND METHOD FOR MANUFACTURING ELECTRONIC COMPONENT

(75) Inventor: Atsushi Saito, Chino (JP)

(73) Assignee: Epson Imaging Devices Corporation (JP)

( * ) Notice: Subject to any disclaimer, the term of this patent is extended or adjusted under 35 U.S.C. 154(b) by 201 days.

(21) Appl. No.: 11/839,572

(22) Filed: Aug. 16, 2007

(65) Prior Publication Data

US 2008/0099914 A1  May 1, 2008

(30) Foreign Application Priority Data

Oct. 25, 2006  (JP)  ............................. 2006-289580

(51) Int. Cl.
*H01L 23/48* (2006.01)
(52) U.S. Cl. ................ 257/737; 257/781; 257/E23.021
(58) Field of Classification Search ................ 257/737, 257/E23.021, E23.033, E23.068, E23.069, 257/781
See application file for complete search history.

(56) References Cited

U.S. PATENT DOCUMENTS

| | | | | |
|---|---|---|---|---|
| 3,772,079 A | * | 11/1973 | Louzon | ....................... 427/123 |
| 5,707,902 A | * | 1/1998 | Chang et al. | ................. 438/614 |
| 6,483,191 B2 | * | 11/2002 | Umezaki | ..................... 257/738 |
| 6,774,314 B2 | * | 8/2004 | Toyoshima et al. | ......... 174/260 |
| 6,841,853 B2 | * | 1/2005 | Yamada | ....................... 257/666 |
| 2005/0062153 A1 | * | 3/2005 | Saito et al. | ................... 257/737 |

FOREIGN PATENT DOCUMENTS

| | | |
|---|---|---|
| JP | 2002-280484 | 9/2002 |
| JP | 2005-119110 | 5/2005 |
| JP | 2005-136402 | 5/2005 |

OTHER PUBLICATIONS

Senju ECO M31 solder data sheet, retrieved from Senju website on Apr. 29, 2010.*

* cited by examiner

*Primary Examiner*—Thao X Le
*Assistant Examiner*—Robert Huber
(74) *Attorney, Agent, or Firm*—Harness, Dickey & Pierce, P.L.C.

(57) ABSTRACT

A semiconductor device includes a bump electrode including a bump made of resin, a base layer disposed on the bump, and a conductive surface layer disposed on the base layer. The base layer has ductility lower than that of the conductive surface layer and includes base regions which are spaced from each other and which are arranged at least in a top zone of the bump electrode.

16 Claims, 6 Drawing Sheets

SEMICONDUCTOR DEVICE, MOUNTING STRUCTURE, ELECTRO-OPTICAL APPARATUS, ELECTRONIC SYSTEM, AND METHOD FOR MANUFACTURING ELECTRONIC COMPONENT

The entire disclosure of Japanese Patent Application No. 2006-289580, filed Oct. 25, 2006 is expressly incorporated by reference herein.

BACKGROUND

1. Technical Field

The present invention relates to a semiconductor device, a mounting structure, an electro-optical apparatus, an electronic system, and a method for manufacturing an electronic component including a bump electrode.

2. Related Art

In general, electronic components for semiconductor devices include substrates and bump electrodes disposed thereon. The bump electrodes are attached to mounting boards such that electronic components are electrically connected to the mounting boards. Examples of the bump electrodes include metal bump electrodes that are prepared in such a manner that a thick coating of a metal such as gold (Au) is deposited on each seed electrode portion. Examples of a mounting technique using the bump electrodes include techniques for mounting driving integrated circuits on substrates for various displays.

For example, JP-A-2005-136402 (hereinafter referred to as Patent Document 1) discloses a bump electrode that includes a resin bump disposed on a substrate and a conductive layer disposed on the resin bump. The conductive layer has a smaller thickness as compared to the metal coatings of the metal bump electrodes. This allows fine patterns to be formed, resulting in a reduction in the pitch between electrodes. The bump electrode has an advantage that the elastic distortion of the resin bump is effective in creating a stable contact pressure and therefore high electric reliability can be achieved.

As disclosed in Patent Document 1, the conductive layer has a multilayer structure consisting of a first conductive sublayer (base sublayer) which is made of, for example, a titanium-tungsten (Ti—W) alloy and which is disposed on the resin bump and a second conductive sublayer (conductive surface sublayer) made of, for example, Au. The multilayer structure is useful in that the first conductive sublayer is tightly bonded to the resin bump and the second conductive sublayer protects the bump electrode from corrosion and has good electric contact properties.

However, the bump electrode has a problem that a mounting portion has non-uniform or large contact resistance or contact defects. This is because the first conductive sublayer has ductility lower than that of the second conductive sublayer and therefore cracks when the bump electrode is distorted during mounting, which can cause cracks in the second conductive sublayer.

SUMMARY

An advantage of an aspect of the present invention is that the distortion of a bump causes no defects such as cracks in a conductive layer during the mounting of a bump electrode and thereby uniform contact resistance and high electric reliability can be achieved.

A semiconductor device according to the present invention includes a bump electrode including a bump made of resin, a base layer disposed on the bump, and a conductive surface layer disposed on the base layer. The base layer has ductility lower than that of the conductive surface layer and includes base regions which are spaced from each other and which are arranged at least in a top zone of the bump electrode.

According to the present invention, since the base layer includes the spaced base regions arranged at least in the top zone of the bump electrode, the base layer is hardly damaged although the top zone of the bump electrode is distorted during the mounting of the bump electrode. Even if the base layer is damaged, the damage of the base layer has only a slight influence on the conductive surface layer. Therefore, the conductivity of the conductive surface layer can be prevented from being varied due to the distortion of the bump electrode; hence, mounting sections can be prevented from having different or large contact resistances.

Since the base sublayer includes the base regions, the bump is not uniformly covered with the base layer but is partly exposed from the base layer. The average area covered with the base regions and the coverage of the base regions are preferably determined such that the base layer is hardly damaged and advantages of the base layer are not reduced.

In the semiconductor device, the base layer preferably has higher affinity to the bump as compared to the conductive surface layer. The base layer may have any characteristics. In general, it is difficult to balance the electrical connection between the bump electrode and a counter electrode and the adhesion between the bump and the base layer. Therefore, it is preferable that the base layer preferably have high affinity to the bump and the electrical connection therebetween be established with the conductive surface layer.

The semiconductor device preferably further includes a base electrode which is located in a region apart from the bump and which is electrically connected to the conductive surface layer. Since the bump electrode and the bump are located in different regions, the bump electrode can be readily formed.

In the semiconductor device, the base layer is preferable made of a conductive material and the conductive surface layer is electrically connected to the base electrode with the base layer disposed therebetween. This allows the base layer and the conductive surface layer to form a conductive layer disposed on the bump electrode, resulting in the enhancement of electrical reliability. The base layer preferably functions as a diffusion-preventing layer for preventing atoms from migrating between the base electrode and the conductive surface layer.

A mounting structure according to the present invention includes a first electronic component including a bump made of resin, a base layer disposed on the bump, and a conductive surface layer disposed on the base layer and also includes a second electronic component including a counter electrode, electrically connected to the bump electrode, having a top zone that is pressed against the counter electrode and therefore distorted. The base layer has ductility lower than that of the conductive surface layer and includes base regions which are spaced from each other and which are arranged in a boundary zone between a portion of the bump electrode that is in contact with the counter electrode and a portion of the bump electrode that is apart from the counter electrode.

In the mounting structure, even if the bump electrode is pressed against the counter electrode and therefore a top zone of the bump electrode is distorted, the conductive surface layer can be prevented from suffering from negative influences because the base regions are arranged in the boundary zone. This prevents a variation or increase in contact resistance.

In the mounting structure, it is preferable that the base layer be made of a conductive material and the conductive surface layer be made of a material having higher corrosion resistance or lower contact resistance with respect to the counter electrode as compared to the conductive material. This allows the base layer and the conductive surface layer to form a conductive layer disposed on the bump electrode, resulting in the enhancement of electrical reliability. Furthermore, the following advantages can be achieved: a reduction in the contact resistance between the conductive surface layer and the counter electrode and an increase in the corrosion resistance of the bump electrode.

An electro-optical apparatus according to the present invention includes an electro-optical panel including the above semiconductor device. Examples of the electro-optical panel include liquid crystal panels, electrophoretic panels, and organic electroluminescent panels. The bump electrode, which includes the bump made of the resin and is included in the semiconductor device, is effective in installing the semiconductor device in a panel including a hard substrate such as a glass substrate, because a connection pad disposed on the hard substrate cannot be expected to be distorted.

An electro-optical apparatus according to the present invention includes the mounting structure. Examples of the second electronic component include electro-optical panels and wiring boards connected to such electro-optical panels. An electronic system according to the present invention includes the electro-optical apparatus.

The present invention provides a method for manufacturing an electronic component including a bump made of resin, a base layer disposed on the bump, and a conductive surface layer disposed on the base layer. The method includes forming the bump on a substrate, forming the base layer on the bump, forming the conductive surface layer on the base layer such that the conductive surface layer has microstructures with fluid permeability, and forming base regions spaced from each other in such a manner that a portion of the base layer which is disposed on the bump and which is covered with the conductive surface layer is processed with gas or liquid passing through the microstructures. The term "microstructures with fluid permeability" used herein means gas- or liquid-permeable microstructures such as grain boundaries and micropores.

In the manufacturing method, although the base regions may be directly formed on the bump during the formation of the base layer, the base regions are formed in such a manner that the base layer is partly processed with such gas or liquid passing through the microstructures as described above. Therefore, it is not necessary to precisely control conditions for forming the base layer. This allows the base regions to be readily formed.

In the manufacturing method, it is preferable that the conductive surface layer be formed and then patterned. Furthermore, the following operations are simultaneously performed: an operation of partly processing the base layer to form the base regions and an operation of patterning the base layer using the patterned conductive surface layer as a mask. This prevents an increase in the number of manufacturing steps, resulting in a reduction in the manufacturing time and cost of the electronic component. That is, since an operation of forming only the base regions is not necessary, the number of manufacturing steps is not increased and the manufacturing time and cost of the electronic component can be reduced.

In the manufacturing method, it is preferable that the bump be treated so as to have a rough surface in the forming operation of the bump, the base layer have surface irregularities which are due to the rough surface of the bump and which are formed in the forming operation of the base layer, and the microstructures be formed in the forming operation of the conductive surface layer in such a manner that the conductive surface layer is provided on the surface irregularities of the base layer. This allows the base layer to be tightly bonded to the bump and also allows the microstructures to be readily formed.

BRIEF DESCRIPTION OF THE DRAWINGS

The invention will be described with reference to the accompanying drawings, wherein like numbers reference like elements.

DESCRIPTION OF EXEMPLARY EMBODIMENTS

Configuration of Electronic Component (Semiconductor Device)

Figure 1:
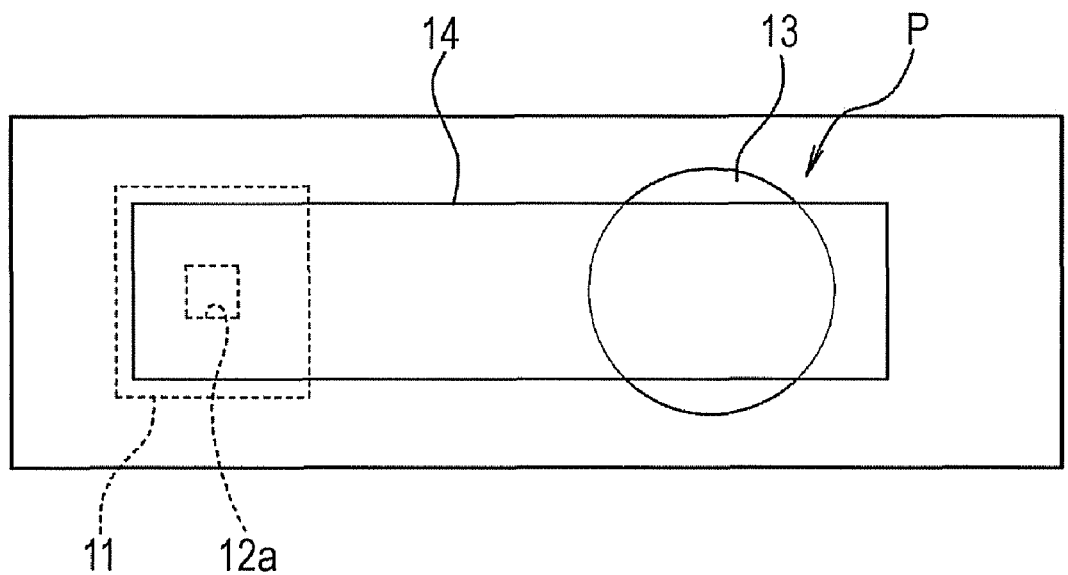
FIG. 1 is a fragmentary plan view of a semiconductor device according to an embodiment of the present invention.
Figure 2:
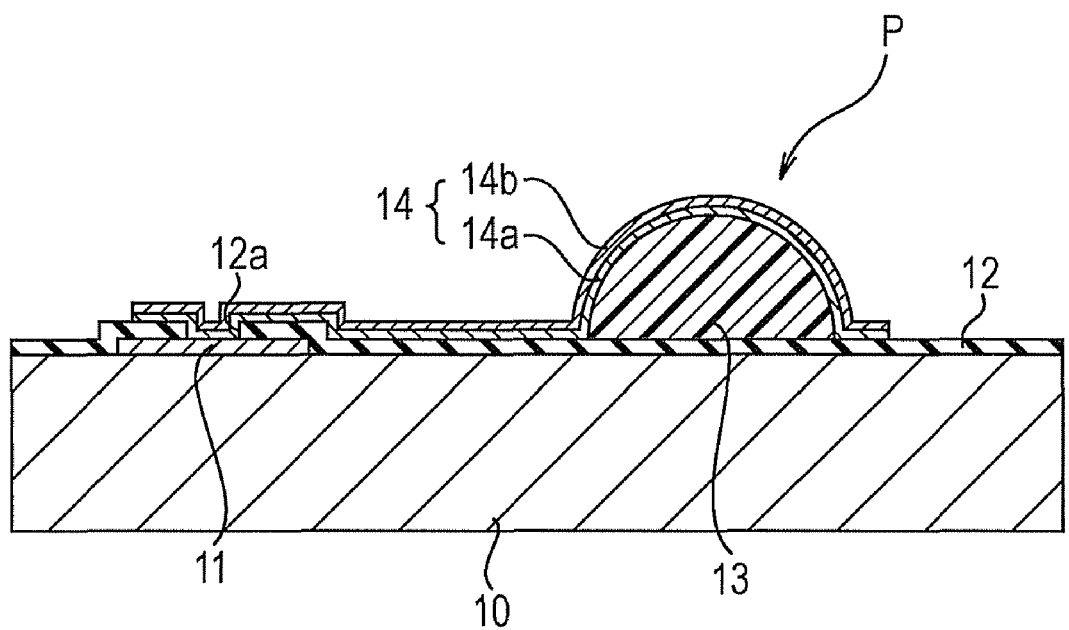
FIG. 2 is a fragmentary vertical sectional view of the semiconductor device.

Embodiments of the present invention will now be described in detail with reference to the accompanying drawings. FIG. 1 is a fragmentary plan view of an electronic component or semiconductor device according to an embodiment of the present invention. FIG. 2 is a fragmentary vertical sectional view of the electronic component or the semiconductor device. In this embodiment, a base electrode 11 made of aluminum (Al) or the like is disposed on a substrate 10, such as a semiconductor substrate, made of single-crystalline silicon. An insulating layer 12, made of silicon dioxide ($SiO_2$) or silicon nitride (SiN), having an opening 12a extends over the substrate 10 and the base electrode 11. The base electrode 11 has a portion exposed from the opening 12a. A bump electrode P is disposed on the insulating layer 12. The bump electrode P includes a bump 13 and a conductive layer 14 as described below in detail.

The bump 13 is disposed on the insulating layer 12 so as to be spaced from the base electrode 11 and the opening 12a. The bump 13 protrudes from the substrate 10 and has a hemispherical shape as shown in FIG. 1. Alternatively, the bump 13 may have a semi-cylindrical shape having an axis parallel to the surface or a prismatic or cylindrical shape having an axis perpendicular to the surface. The bump 13 may be made of a resin such as an acrylic resin, a phenol resin, a silicone resin, polyimide, silicone-modified polyimide, or an epoxy resin. In particular, the bump 13 is preferably made of a photosensitive resin. Preferable examples of the photosensitive resin include acrylic photosensitive resins capable of forming a desired shape by controlling exposure conditions. The bump 13 preferably has a rough surface so as to be tightly bonded to the conductive layer 14.

The height of the bump 13 depends on a mounting technique and/or properties of a mounting portion and preferably ranges from 5 to 1000 μm. For semiconductor uses, the bump 13 preferably has a height of about 5 to 50 μm and more preferably about 10 to 20 μm.

The conductive layer 14 extends over the bump 13 and the opening 12a to be electrically connected to the base electrode 11. The conductive layer 14 preferably has a thickness of about 100 nm to 1 μm and more preferably about 300 to 800 nm. In this embodiment, the conductive layer 14 includes a base sublayer 14a and a conductive surface sublayer 14b, that is, the conductive layer 14 has a two-layer structure. The base sublayer 14a is preferably made of, but not limited to, a conductive material. Examples of such a conductive material include a Ti—W alloy, copper (Cu), chromium (Cr), nickel (Ni), palladium (Pd), Ti, W, and a nickel-vanadium (Ni—V) alloy. The base sublayer 14a is effective in enhancing the adhesion between the conductive layer 14 and the bump 13. The base sublayer 14a preferably functions as a diffusion-preventing layer for preventing a metal component (for example, Al) contained in the base electrode 11 from diffusing and therefore is preferably made of, for example, a Ti—W alloy. The base sublayer 14a preferably has a thickness of about 100 to 150 nm.

Since the base sublayer 14a usually has ductility lower than that of the conductive surface sublayer 14b, the base sublayer 14a may crack when the bump electrode P is pressed against a counter electrode and therefore is distorted. This exerts a negative influence on the conductive surface sublayer 14b. In order to prevent this problem, the base sublayer 14a includes fine base regions 14s that are spaced from each other so as to form a dotted pattern, as described below.

The conductive surface sublayer 14b is preferably made a conductive material that has properties, for example, low contact resistance to the counter electrode, suitable for a surface portion of the bump electrode P Examples of such a conductive material include Au, silver (Ag), Cu, and platinum (Pt). The conductive surface sublayer 14b is more preferably made Au or Pt because these metals have high corrosion resistance in addition to low contact resistance. The conductive surface sublayer 14b preferably has a thickness of about 300 to 800 nm.

With reference to FIGS. 1 and 2, the electronic component or the semiconductor device includes the single bump electrode P. The electronic component or the semiconductor device may include a plurality of bump electrodes, arranged on a mounting surface thereof, including bumps and conductive layers. In this case, these bumps may be spaced from each other and these conductive layers may be also spaced from each other. Alternatively, these bumps may be connected to each other in a desired direction and these conductive layers may be separately arranged on these bumps.

Figure 3:
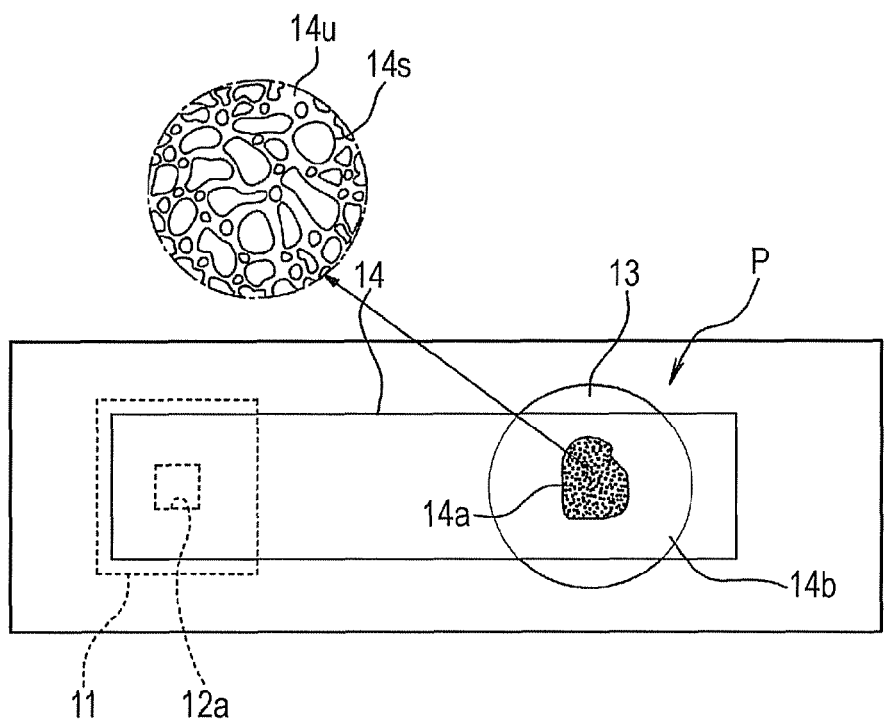
FIG. 3 is a plan view of the semiconductor device.
Figure 4:
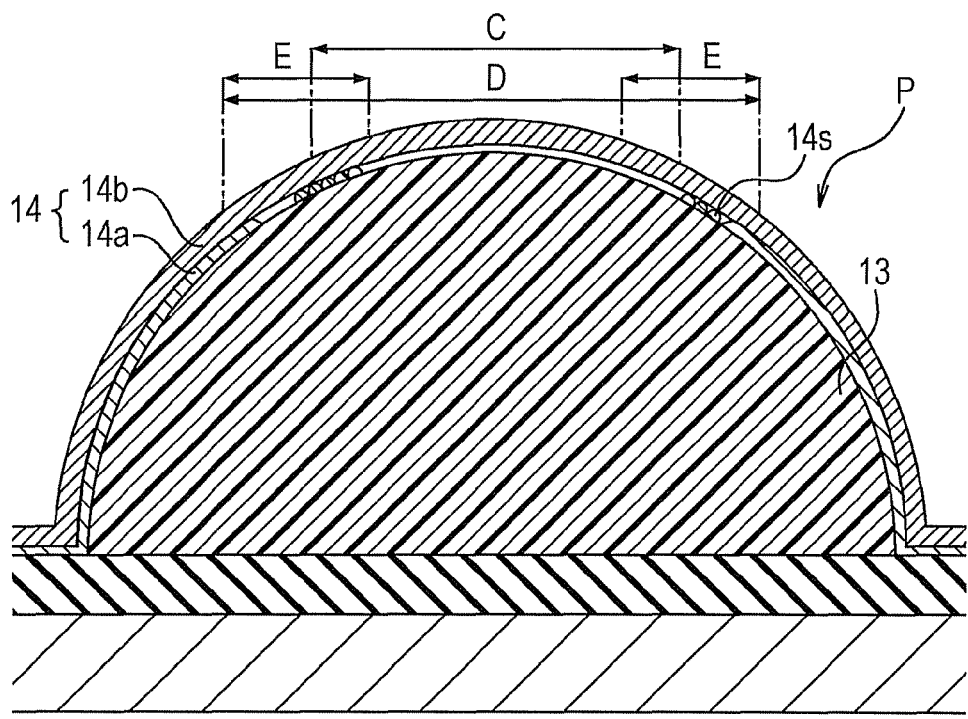
FIG. 4 is an enlarged vertical sectional view of a bump electrode included in the semiconductor device.

FIG. 3 is a plan view of the electronic component or the semiconductor device in which the conductive surface sublayer 14b is partly removed from a top zone of the bump electrode P. In FIG. 3, a portion of the base sublayer 14a that is located under the removed portion of the conductive surface sublayer 14b is shown in an enlarged manner. FIG. 4 is an enlarged vertical sectional view of the bump electrode P. The base sublayer 14a includes the base regions 14s, which are spaced from each other so as to form such a dotted pattern as described above. The base regions 14s are located in at least a top zone of the bump electrode P. Since the base sublayer 14a includes the base regions 14s, the bump 13 is not completely covered with the base sublayer 14a but is partly exposed from the base sublayer 14a. With reference to FIGS. 3 and 4, the base sublayer 14a has a vacant region 14u surrounding each base region 14s. The average area covered with the base regions 14s is about 100 nm$^2$ to 10 μm$^2$ and the coverage of the base regions 14s is about 20% to 80%. Alternatively, the base sublayer 14a may have fine vacant regions spaced from each other instead of the vacant region 14u.

The base regions 14s may be arranged in the whole of the base sublayer 14a or arranged on the bump 13, which is a portion of the bump electrode P. The base regions 14s are preferably arranged only in a top zone of the bump electrode P that is distorted during mounting. This is because the base regions 14s may exert effects on the distortable top zone of the bump electrode P, particularly on a predetermined region of the bump electrode P that includes the boundary between a portion in contact with the counter electrode and a portion apart from the counter electrode.

The reason why the base sublayer 14a includes the base regions 14s is to prevent the base sublayer 14a from being partly damaged when the bump electrode P is pressed against the counter electrode and therefore is distorted during mounting. The damage of the base sublayer 14a exerts a negative influence on the conductive surface sublayer 14b or causes cracks in the conductive surface sublayer 14b. This can cause a variation or increase in contact resistance. Such a variation or increase in contact resistance is caused not only by the cracks in the conductive surface sublayer 14b but also by the variation or increase in the sheet resistance of the conductive surface sublayer 14b that is distorted by the cracking of the base sublayer 14a.

With reference to FIG. 4, the bump electrode P has a first surface zone C that is brought into contact with the counter electrode (not shown). It is difficult to precisely define the first surface zone C because the first surface zone C is affected by the mounting pressure and/or the mounting temperature. However, the first surface zone C can be substantially determined by the theoretical calculation or experimental investigation of a mounting step. The bump electrode P has a second surface zone D containing the first surface zone C. The second surface zone D is distorted during mounting. Therefore, the base regions 14s may be arranged in the second surface zone D. The bump electrode P also has a boundary zone E extending from the edge of the second surface zone D to an inner portion of the first surface zone C. The boundary zone E includes the boundary between the first surface zone C and a portion of the bump electrode P that is not brought into contact with the counter electrode. The boundary zone E is particularly significantly distorted; hence, a portion of the base sublayer 14a that is located under the boundary zone E is likely to be damaged. The presence of the base regions 14s in the boundary zone E provides a sufficient improvement. Furthermore, the absence of the base regions 14s and the vacant region 14u from the first surface zone C enhances the electrical connection between the counter electrode and the bump electrode P. The base regions 14s and the vacant region 14u may be arranged in both the first surface zone C and the boundary zone E such that the percentage of the base regions 14s in the first surface zone C is large and the percentage of the vacant region 14u in the boundary zone E is large.

Method for Manufacturing Electronic Component (Semiconductor Device)

Figure 5:
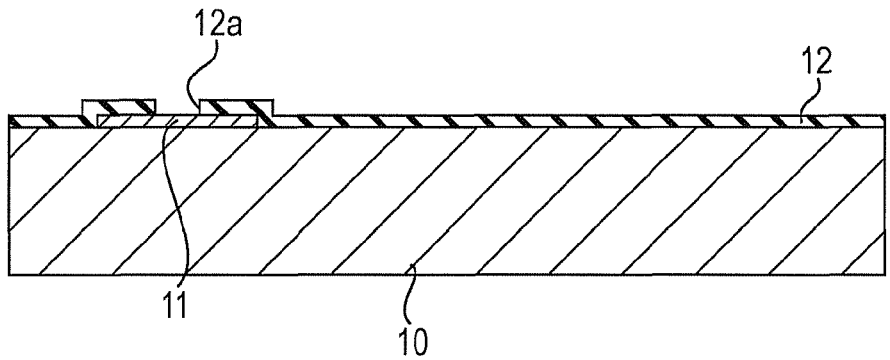
FIG. 5 is an illustration showing a step of a method for manufacturing the semiconductor device.

A method for manufacturing the electronic component (semiconductor device) according to an embodiment of the present invention will now be described with reference to FIGS. 5 to 9. In the method, as shown in FIG. 5, an Al layer for forming the base electrode 11 is deposited on the substrate 10 by a vapor deposition process or a sputtering process. The Al layer is patterned by an etching process or another process, whereby the base electrode 11 is formed together with various wires on the substrate 10. The insulating layer 12 is formed over the substrate 10 and base electrode 11 by a chemical vapor deposition (CVD) process, a sputtering process, or another process. The opening 12a is formed by patterning the insulating layer 12 such that the base electrode 11 is partly exposed from the opening 12a.

Figure 6:
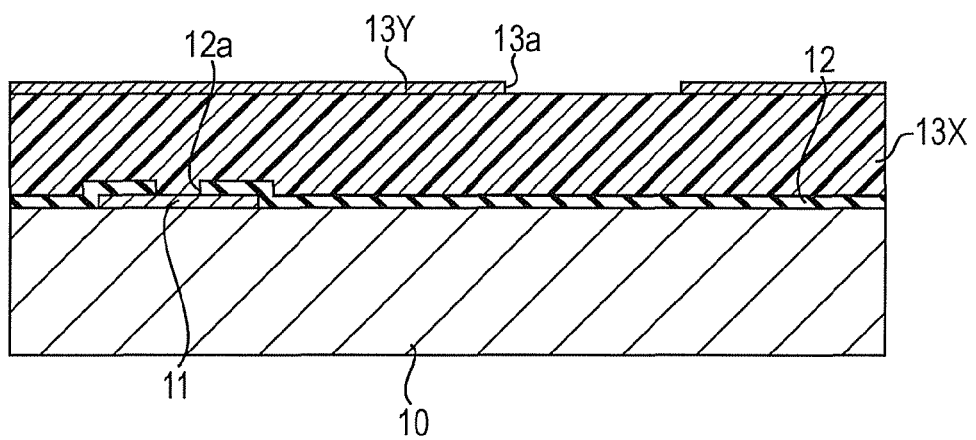
FIG. 6 is an illustration showing a step of the manufacturing method.
Figure 7:
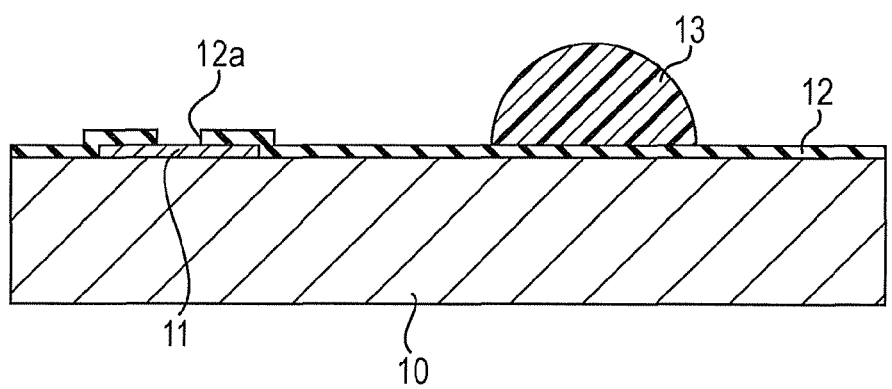
FIG. 7 is an illustration showing a step of the manufacturing method.

As shown in FIG. 6, a photosensitive resin 13X such as an acrylic photosensitive resin is applied to the insulating layer 12 by a coating process, exposed using an exposure mask 13Y having an aperture 13a, and then developed, whereby the bump 13 is formed as shown in FIG. 7. With reference to FIGS. 6 and 7, a portion of the photosensitive resin 13X that is located under the aperture 13a remains to form the bump 13. Since the remaining portion of the photosensitive resin 13X can be controlled in thickness by adjusting the light exposure, the bump 13 can be readily formed using the aperture 13a having a simple shape so as to have a hemispherical shape.

The bump 13 is preferably treated so as to have a rough surface. Such a rough surface can be formed by plasma-treating the bump 13 using gaseous oxygen. The bump 13 preferably has a surface roughness of about 50 to 500 nm and more preferably 100 to 150 nm.

Figure 8:
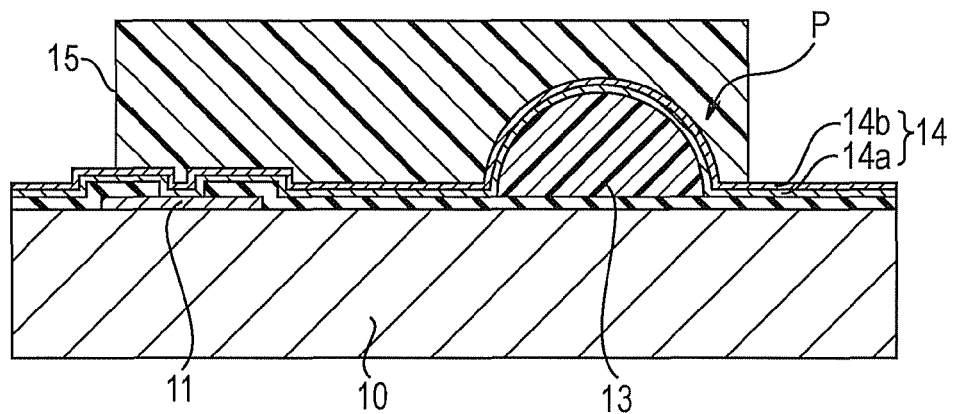
FIG. 8 is an illustration showing a step of the manufacturing method.

As shown in FIG. 8, the conductive layer 14 is formed over the insulating layer 12 and the bump 13. In particular, the base sublayer 14a and the conductive surface sublayer 14b are formed in that order by a vapor deposition process or a sputtering process. Alternatively, the base sublayer 14a and the conductive surface sublayer 14b may be formed by a plating process such as an electroless plating process or an electroplating process.

The base sublayer 14a may be formed so as to entirely cover the bump 13 in this step and then processed in a subsequent step such that the base regions 14s are formed. Alternatively, the base sublayer 14a may be processed in this step such that the base regions 14s are formed. In this case, although the base sublayer 14a is formed by a deposition process such as a sputtering process, a vapor deposition process, or an electroless plating process, the formation of the base sublayer 14a is terminated such that the base sublayer 14a does not completely cover the bump 13 but partially covers the bump 13. When the time taken to form the base sublayer 14a is long, the base regions 14s are formed. However, when the time taken to form the base sublayer 14a is short, vacant regions are formed so as to be spaced from each other. The base sublayer 14a may be formed by a sputtering process using a mask having a dotted pattern for forming the base regions 14s.

The base sublayer 14a entirely covers the substrate 10 as described below. Since the base sublayer 14a extends on the bump 13, which has the rough surface as described above, a portion of the base sublayer 14a that is located on the bump 13 has surface irregularities due to the rough surface of the bump 13. When the base sublayer 14a has a thickness close to the surface roughness (about 100 to 150 nm) of the bump 13, this portion of the base sublayer 14a has a surface roughness corresponding to that of the bump 13.

Figure 10:
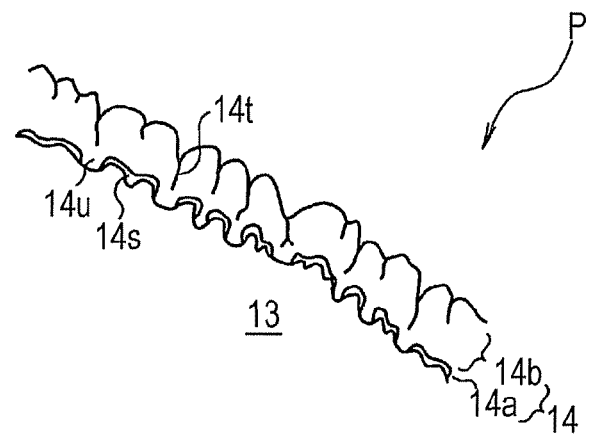
FIG. 10 is an enlarged view of a surface portion of the bump electrode.

Since the conductive surface sublayer 14b is formed on the base sublayer 14a, fine unit structures corresponding to the surface irregularities of the base sublayer 14a are formed during the formation of the conductive surface sublayer 14b; hence, microstructures 14t with fluid permeability is formed in the conductive surface sublayer 14b. That is, the fine unit structures are independently grown on this portion of the base sublayer 14a to form a layer structure in which the unit structures are arranged close to each other as shown in FIG. 10. Gas and liquid can pass through the gaps between the unit structures.

Figure 9:
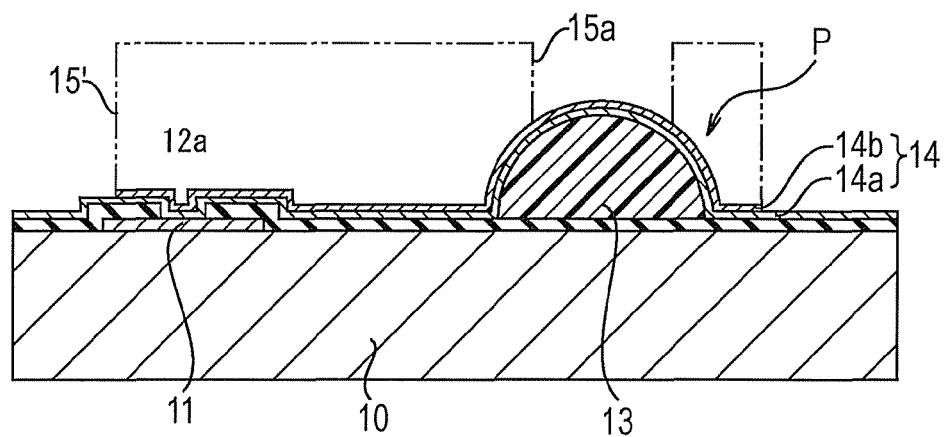
FIG. 9 is an illustration showing a step of the manufacturing method.

As shown in FIG. 9, an unnecessary portion is removed from the conductive surface sublayer 14b by an etching process such as a wet etching process or a dry etching process in such a manner that an area ranging from the bump electrode P to the base electrode 11 is covered with a mask 15 made of a resist.

The base sublayer 14a is patterned by the following process using the resulting conductive surface sublayer 14b as a mask: a process substantially that is incapable of removing the conductive surface sublayer 14b but is capable of removing the base sublayer 14a. Examples of such a process include a wet etching process using a predetermined etching solution and a reactive dry etching process with selectivity.

In this step, the conductive surface sublayer 14b is formed so as to have the microstructures 14t as shown in FIG. 10. Since the base sublayer 14a is patterned using the conductive surface sublayer 14b as a mask as described above, not only portions exposed from the conductive surface sublayer 14b are removed from the base sublayer 14a but also portions covered with the conductive surface sublayer 14b are partly removed from the base sublayer 14a with an etching solution or etching gas passing through the microstructures 14t. This allows the base sublayer 14a to have the base regions 14s and the vacant region 14u.

A mask 15' which is defined by the two-dotted line in FIG. 9 and which has an opening 15a may be used to pattern the base sublayer 14a. The mask 15' may be the same as or different from the above mask 15. If the base sublayer 14a is patterned in such a manner that the mask 15' is placed on the conductive surface sublayer 14b, a portion of the base sublayer 14a that is located under the opening 15a (that is, the top zone of the bump electrode P, or the second surface zone D) can be processed into the base regions 14s. Alternatively, only a portion of the base sublayer 14a that corresponds to the boundary zone E may be processed into the base regions 14s such that a portion of the base sublayer 14a that corresponds to a center portion of the top zone of the bump 13 is not processed.

In this case, a portion of the base sublayer 14a that corresponds to a contact between the base electrode 11 and the conductive layer 14 is not processed into the base regions 14s; hence, the contact therebetween has low electrical resistance. No etching solution or etching gas reaches the contact; hence, the contact is prevented from being corroded. The wiring resistance of the conductive layer 14 can be reduced by limiting a portion of the base sublayer 14a that is processed into the base regions 14s.

In this embodiment, the base sublayer 14a (made of, for example, the Ti—W alloy), which is disposed between the base electrode 11 (made of, for example, Al) and the conductive surface sublayer 14b (made of, for example, Au), functions as a diffusion-preventing layer for preventing atoms (for example, Al atoms) in the base electrode 11 from diffusing in the conductive surface sublayer 14b during heat treatment. In order to allow the base sublayer 14a to have a high diffusion-preventing function, it is preferable that no base regions 14s be present on the base electrode 11 and the base electrode 11 be entirely covered with the base sublayer 14a.

In the method of this embodiment, since the base sublayer 14a is processed by making use of the microstructures 14t, which are present in the conductive surface sublayer 14b and have fluid permeability, the base regions 14s can be readily formed. If the base regions 14s are formed in the step of patterning the base sublayer 14a, a step of forming the base regions 14s only is not necessary. That is, it is not necessary to increase the number of steps of the method; hence, the manufacturing time and cost of the electronic component can be prevented from being increased.

Since the bump 13 is treated so as to have the rough surface, the bump 13 can be tightly bonded to the base sublayer 14a and the base sublayer 14a has the surface irregularities due to the rough surface of the bump 13. Since the conductive surface sublayer 14b is formed on the surface irregularities thereof, the microstructures 14t can be readily formed.

Figure 11:
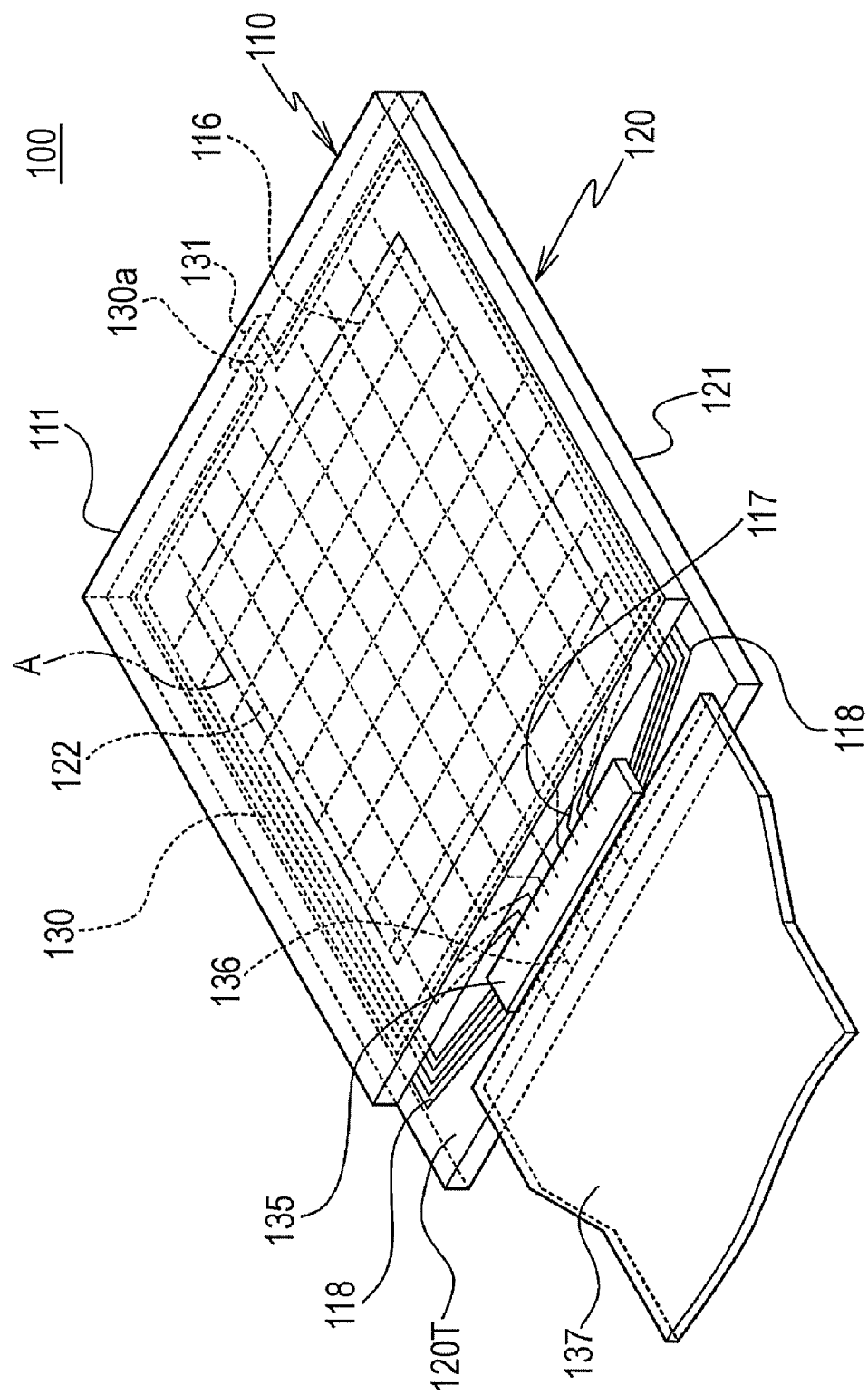
FIG. 11 is a schematic perspective view of an electro-optical apparatus.
Figure 12:
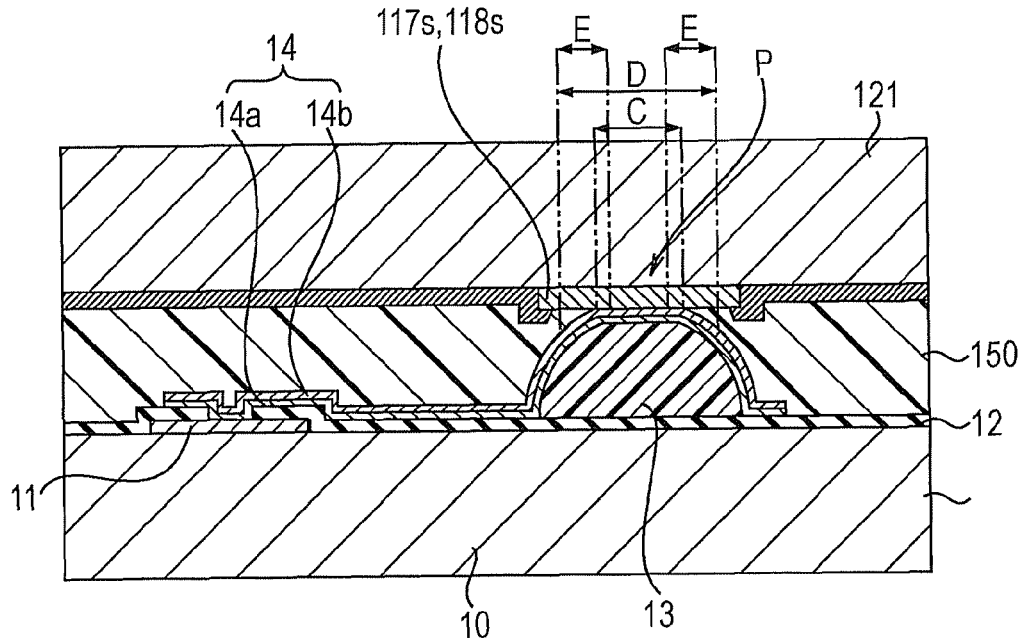
FIG. 12 is a partially enlarged sectional view of a mounting structure.

Configuration of Mounting Structure and Configuration of Electro-Optical Apparatus An electro-optical apparatus according to an embodiment of the present invention and a mounting structure according to an embodiment of the present invention will now be described in detail with reference to FIGS. 11 and 12, respectively. FIG. 11 is a schematic perspective view of the electro-optical apparatus. FIG. 12 is a partially enlarged sectional view of the mounting structure.

With reference to FIG. 11, the electro-optical apparatus is represented by reference numeral 100 and is a liquid crystal apparatus including a liquid crystal display (liquid crystal panel). The electro-optical apparatus 100 includes a first substrate 110, a second substrate 120, a sealant 130, and a liquid crystal. The first and second substrates 110 and 120 are transparent and are bonded to each other with the sealant 130. The liquid crystal is disposed between the first and second substrates 110 and 120. The electro-optical apparatus 100 has a driving region A surrounded by the sealant 130 and also has an inlet 130a through which the liquid crystal is introduced. The inlet 130a is sealed with a sealing member 131.

The first substrate 110 includes a first base member 111 made of glass or plastic, a reflective layer made of a reflective material or a metal such as Al or Ag, a color filter, a first insulating layer, first electrodes 116 made of a transparent conductive material such as indium tin oxide (ITO), and a first alignment layer made of polyimide, these components being arranged under the inner face of the first base member 111.

The second substrate 120 includes a second base member 121 made of glass or plastic, first wires 122, devices (for example, two-terminal nonlinear devices such as thin-film diodes (TFDs) and/or three-terminal nonlinear devices such as thin-film transistors (TFTs)) connected to the first wires 122, a second insulating layer, second electrodes made of the transparent conductive material, and a second alignment layer made of polyimide, these components being arranged above the inner face of the second base member 121.

The first electrodes intersect with the second electrodes in plan view. Each segment containing one of the intersections corresponds to a pixel capable of controlling the alignment of molecules of the liquid crystal, the molecules being located between each first electrode and second electrode. The pixels are arranged in a matrix in the driving region A as shown in FIG. 11.

The second substrate 120 has a projecting section 120T located outside the first substrate 110. The projecting section 120T has a semiconductor device 135, mounted thereon, containing a liquid crystal-driving circuit and the like and also has second wires 117 and third wires 118 extending thereon. The semiconductor device 135 is electrically connected to the first electrodes 116 and the first, second, and third wires 122, 117, and 118. Input terminals 136 and a wiring board 137 (for example, a flexible wiring board) are disposed on an end portion of the projecting section 120T. The input terminals 136 are electrically connected to the semiconductor device 135 and wires (not shown) extending from the wiring board 137.

A spacer (not shown) made of an insulating resin is located between the first and second substrates 110 and 120 so as to maintain the distance between the first and second substrates 110 and 120. The spacer is preferably fixed on one of the first and second substrates 110 and 120. A retardation film and a polarizing film (both not shown) may be attached to the outer face of each of the first and second substrates 110 and 120 as required.

The semiconductor device 135 includes bump electrodes P having substantially the same configuration as that of the bump electrode P of the above electronic component (semiconductor device). With reference to FIG. 12, these bump electrodes P are electrically connected to first counter electrodes (connection pads) 117s and second counter electrodes (connection pads) 118s, the first and second counter electrodes 117s and 118s being located at the tips of the second and third wires 117 and 118, respectively. The electrical connection between these bump electrodes P and the first and second counter electrodes 117s and 118s is established as follows: an insulating resin film made of a heat-curable insulating resin 150 is provided between the semiconductor device 135 and the projecting section 120T, top zones of bumps 13 included in these bump electrodes P are distorted in such a manner that these bump electrodes P are pressed against the first and second counter electrodes 117s and 118s while the semiconductor device 135 is being heated such that the heat-curable insulating resin 150 is softened, and the heat-curable insulating resin 150 is then cured.

Since these bump electrodes P are pressed against the first and second counter electrodes 117s and 118s and therefore these bumps 13 are elastically distorted, the resilience of each bump 13 acts as a contact pressure to maintain the electrical connection between. The bump 13 has a first surface zone C in contact with one of the first and second counter electrodes 117s and 118s, a second surface zone D that is distorted, and a boundary zone E. The first and second surface zones C and D and the boundary zone E are substantially the same as those shown in FIG. 4. The bump 13 includes base regions 14s which are arranged in the second surface zone D of the boundary zone E and which are spaced from each other so as to form a dotted pattern. This prevents these bump electrodes P from having different or large resistances.

Electronic System

Figure 13:
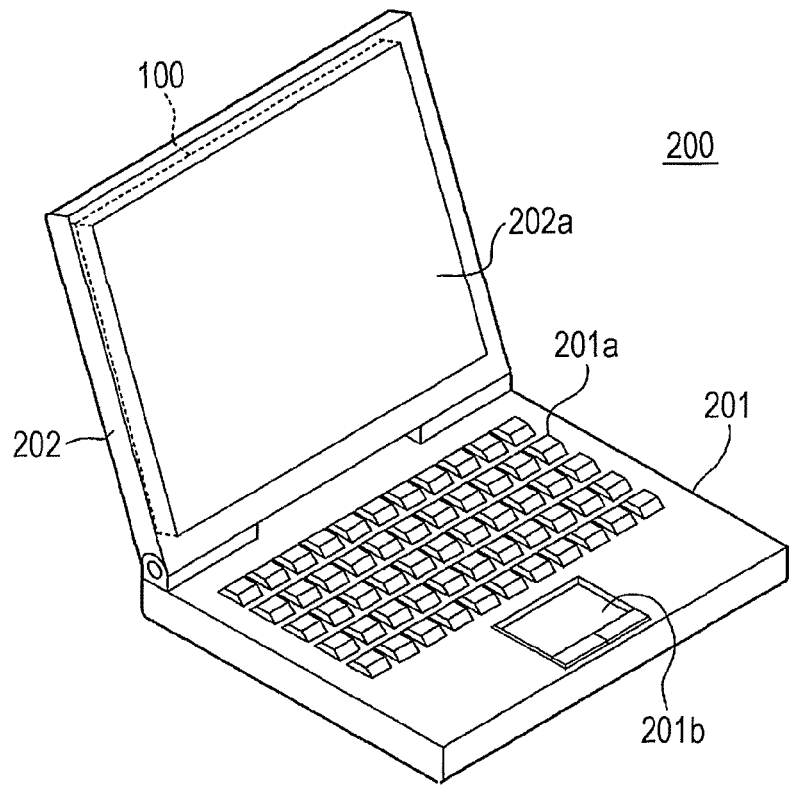
FIG. 13 is a schematic perspective view of an example of an electronic system.

An electronic system according to an embodiment of the present invention will now be described. The electronic system includes the above electro-optical apparatus 100. FIG. 13 shows a notebook personal computer 200 that is an example of the electronic system. The notebook personal computer 200 includes a main body 201 including a plurality of operation keys 201a and an operation unit 201b and also includes a display section 202, connected to the main body 201, including a screen 202a. The main body 201 and the display section 202 are swingably connected to each other. The electro-optical apparatus (liquid crystal apparatus) 100 is disposed in the display section 202 and therefore a desired image can be displayed on the screen 202a. The notebook personal computer 200 further includes a display control circuit, disposed therein, for controlling the electro-optical apparatus 100. The display control circuit supplies control signals to a driving circuit, such as a liquid crystal-driving circuit, disposed in the semiconductor device 135 to determine the display mode of the electro-optical apparatus 100.

Examples of the electronic system include liquid crystal televisions, car navigation systems, pagers, electronic notebooks, portable calculators, work stations, video phones, and point-of-sale (POS) terminals in addition to the notebook personal computer 200. The electro-optical apparatus 100 is suitable for display sections of these electronic systems.

A semiconductor device, a mounting structure, an electro-optical apparatus, an electronic system, and a method for manufacturing an electronic component according to the present invention are not limited to the above embodiments and may be variously modified within the scope of the present invention. In one of the embodiments, the semiconductor device includes the bump electrode P. A mounting structure may include an electronic component, other than the semiconductor device, including a bump electrode P.

What is claimed is:

1. A semiconductor device comprising:
   a bump electrode including a bump made of resin,
   a base layer disposed on the bump, the base layer being made of a conductive material, and
   a conductive surface layer disposed on the base layer,
   wherein the base layer has ductility lower than that of the conductive surface layer and includes base layer regions that are spaced from each other by vacant regions,
   the vacant regions are devoid of a material forming the base layer regions such that the conductive surface layer contacts the resin of the bump in the vacant regions,
   the base layer regions and the vacant regions are only arranged in a top zone of the bump electrode, and
   the base layer entirely covers the bump except at the top zone where the conductive surface layer includes the base layer regions and the vacant regions.

2. The semiconductor device according to claim 1, wherein the base layer has higher affinity to the bump as compared to the conductive surface layer.

3. The semiconductor device according to claim 1, further comprising a base electrode which is located in a region apart from the bump and which is electrically connected to the conductive surface layer.

4. The semiconductor device according to claim 3, wherein the conductive surface layer is electrically connected to the base electrode with the base layer disposed therebetween.

5. A mounting structure comprising:
   a first electronic component including a bump made of resin, a conductive base layer disposed on the bump, and a conductive surface layer disposed on the conductive base layer; and
   a second electronic component including a counter electrode, electrically connected to the first electronic component bump, the bump of the first electronic component having a top zone that is pressed against the counter electrode and therefore distorted,
   wherein the base layer has ductility lower than that of the conductive surface layer and includes base regions which are spaced from each other by vacant regions that are devoid of a material forming the base regions such that the conductive surface layer contacts the resin of the bump in the vacant regions,
   the base regions and the vacant regions are only arranged in top zone between a portion of the bump of the first electronic component that is in contact with the counter electrode and a portion of the bump of the first electronic component that is apart from the counter electrode, and
   the base layer entirely covers the bump except at the top zone where the conductive surface layer includes the base layer regions and the vacant regions.

6. The mounting structure according to claim 5, wherein the conductive surface layer is made of a material having higher corrosion resistance or lower contact resistance with respect to the counter electrode as compared to the conductive base layer.

7. An electro-optical apparatus comprising an electro-optical panel including the semiconductor device according to claim 1.

8. An electro-optical apparatus comprising the mounting structure according to claim 5.

9. An electronic system comprising the electro-optical apparatus according to claim 7.

10. The semiconductor device of claim 1, wherein the conductive surface layer directly contacts the resin of the bump in the vacant regions.

11. The mounting structure of claim 5, wherein the conductive surface layer directly contacts the resin of the bump in the vacant regions.

12. The semiconductor device of claim 1, wherein the base layer is formed from a material selected from the group consisting of a Ti-W alloy, Cr, Ni, Pd, Ti, W, and a Ni—V alloy, and the conductive surface layer is formed from a material selected from the group consisting of Au, Ag, Cu, and Pt.

13. The mounting structure of claim 5, wherein the conductive base layer is formed from a material selected from the group consisting of a Ti-W alloy, Cr, Ni, Pd, Ti, W, and a Ni—V alloy, and the conductive surface layer is formed from a material selected from the group consisting of Au, Ag, Cu, and Pt.

14. The semiconductor device of claim 1, wherein the conductive surface layer entirely covers the bump.

15. The mounting structure of claim 5, wherein the conductive surface layer entirely covers the bump.

16. A device comprising:
   a first electronic component including a bump electrode, the bump electrode consisting of:
      a bump made of resin;
      a conductive base layer disposed on the bump;
      a conductive surface layer disposed on the conductive base layer, the conductive surface layer entirely covering the bump; and
      a contact region; and
   a second electronic component including a counter electrode that couples to the bump electrode at the contact region,
   wherein in only the contact region where the counter electrode contacts the bump electrode, the conductive base layer includes base layer regions that are spaced from each other by vacant regions that are devoid of a conductive material forming the base layer regions such that the conductive surface layer contacts the resin of the bump in the vacant regions; and
   the conductive base layer covers the bump except at the contact region where the conductive base layer includes the base layer regions and the vacant regions.

* * * * *